United States Patent [19]

Takahasi et al.

[11] Patent Number: 5,409,558
[45] Date of Patent: Apr. 25, 1995

[54] METHOD OF MANUFACTURING A GRADIENT MAGNETIC FIELD COIL ASSEMBLY OF AN MRI APPARATUS

[75] Inventors: Ryoichi Takahasi; Yuzo Yoshida, both of Ootawara; Daihachirou Tsuruno, Tochigi, all of Japan

[73] Assignee: Kabushiki Kaisha Toshiba, Kawasaki, Japan

[21] Appl. No.: 255,564

[22] Filed: Jun. 8, 1994

Related U.S. Application Data

[63] Continuation of Ser. No. 975,989, Nov. 13, 1992, abandoned, which is a continuation of Ser. No. 530,603, May 30, 1990, abandoned.

[30] Foreign Application Priority Data

May 30, 1989 [JP] Japan .................................. 1-137781

[51] Int. Cl.6 ............................................. B32B 31/00
[52] U.S. Cl. ........................................ 156/172; 29/605;
156/245; 335/213; 335/296; 335/299
[58] Field of Search ............ 156/172, 245, 268, 272.2,
156/272.4, 228, 285, 307; 324/318–320, 322;
29/605, 606, 599; 335/213, 296, 299; 336/70,
82, 84 M, 84 R; 505/705, 727, 739, 844;
242/7.07, 7.08; 219/10.79, 10.57

[56] References Cited

U.S. PATENT DOCUMENTS

| | | | |
|---|---|---|---|
| 1,633,577 | 6/1927 | Franks | 156/172 |
| 3,043,994 | 7/1962 | Anderson et al. | |
| 3,932,928 | 1/1976 | King | 29/605 |
| 4,310,799 | 1/1982 | Hutchinson et al. | 324/319 |
| 4,494,097 | 1/1985 | Lenders | 335/210 |
| 4,496,926 | 1/1985 | Kubo et al. | 336/205 |
| 4,500,860 | 2/1985 | Vermilyen | 324/320 |
| 4,509,030 | 4/1985 | Vermilyen | 335/299 |
| 4,554,731 | 11/1985 | Borden | 29/605 |
| 4,636,729 | 1/1987 | Maurer et al. | 335/299 |
| 4,733,189 | 3/1988 | Punchard et al. | |
| 4,737,716 | 4/1988 | Roemer et al. | |
| 4,763,848 | 8/1988 | Bernhard | 29/605 |
| 4,794,338 | 12/1988 | Roemer et al. | |
| 4,840,700 | 6/1989 | Edelstein et al. | 156/634 |
| 5,088,185 | 2/1992 | Siebold et al. | 29/605 |
| 5,111,172 | 5/1992 | Laskaris | 335/299 |

FOREIGN PATENT DOCUMENTS

| | | | |
|---|---|---|---|
| 0235809 | 9/1981 | European Pat. Off. | 29/605 |
| 122133A1 | 10/1984 | European Pat. Off. | |
| 16196 | 6/1953 | Germany | |
| 1514445 | 9/1970 | Germany | |
| 3444388A1 | 8/1985 | Germany | |
| 1038655 | 3/1976 | Japan | 336/205 |
| 52-49458 | 4/1977 | Japan | |
| 0049458 | 4/1977 | Japan | 336/205 |
| 57-78111 | 5/1982 | Japan | 29/605 |
| 0792327 | 12/1980 | U.S.S.R. | 29/605 |

Primary Examiner—Michael W. Ball
Assistant Examiner—Michele K. Yoder
Attorney, Agent, or Firm—Limbach & Limbach

[57] ABSTRACT

Saddle coils are manufactured by placing wires in grooves formed in a first mold, so that the spatial arrangement of the saddle coils are determined by the positions of the grooves. This enables the wires to be precisely located in predetermined positions and assures a precise spatial arrangement of the saddle coils. Further, the wire is held by guides to form a solenoid coil. With this arrangement, high positional accuracies of the saddle coils and the solenoid coil are obtained, improving the detecting accuracy of the slice position of an object to be examined.

6 Claims, 12 Drawing Sheets

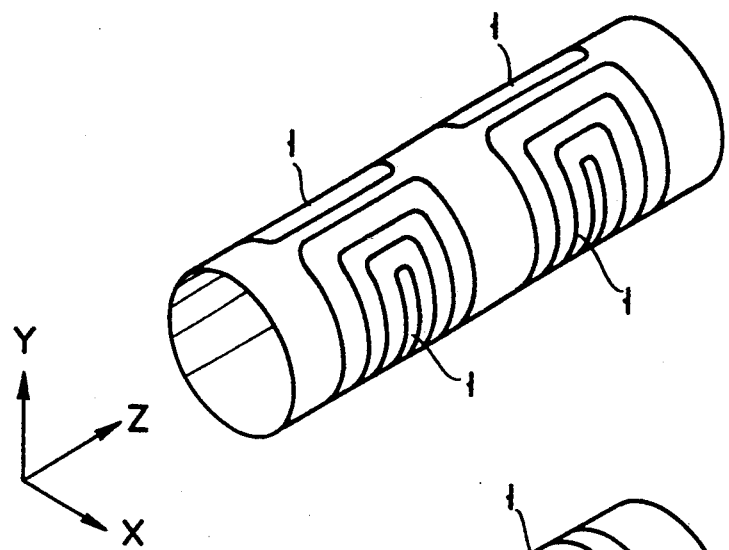
F I G. 1A
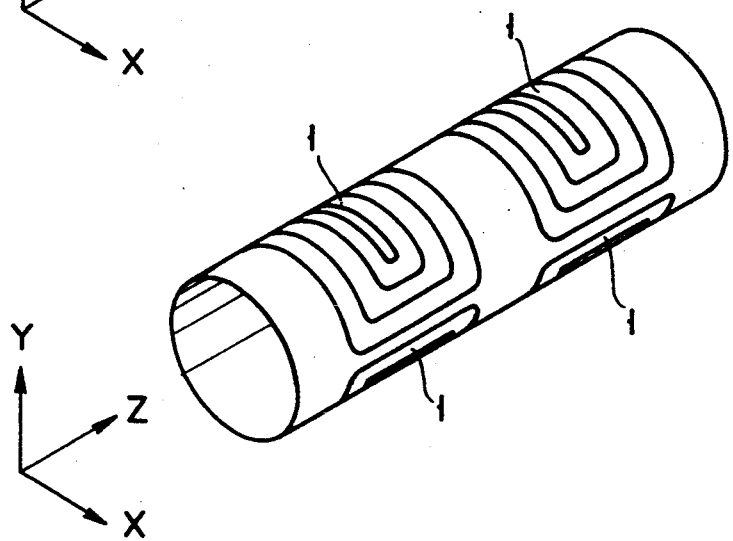
F I G. 1B
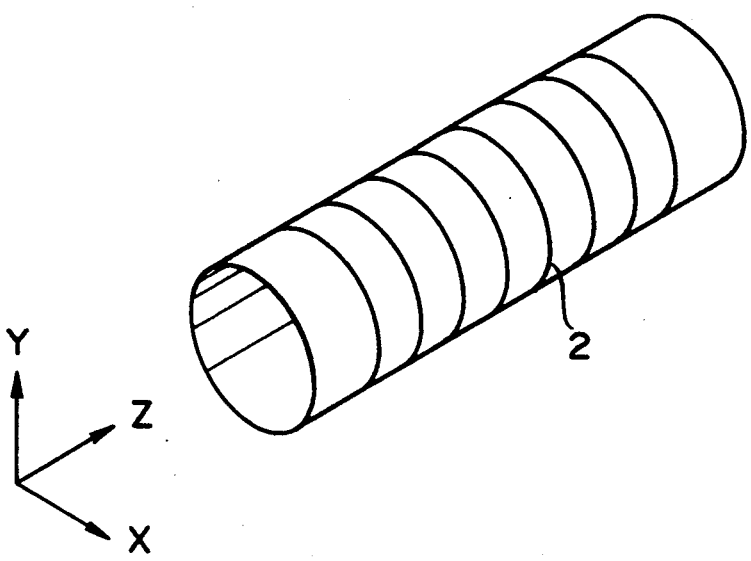
F I G. 1C

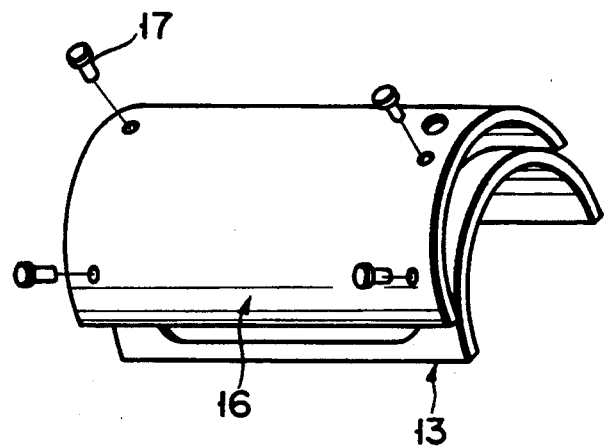
F I G. 8
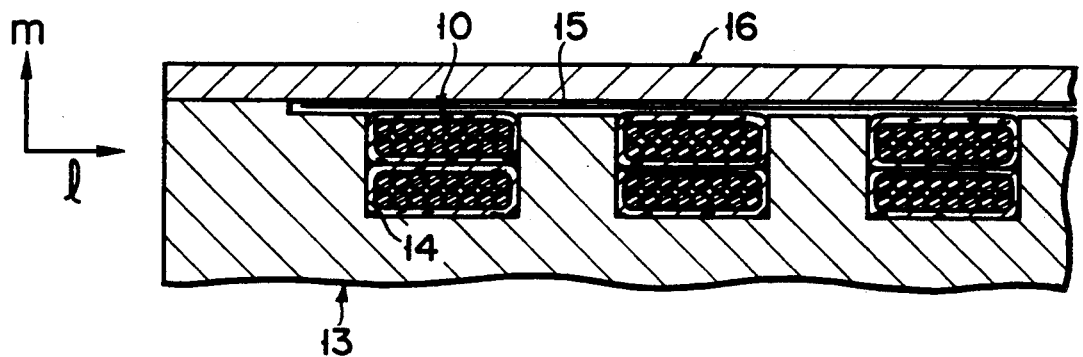
F I G. 9
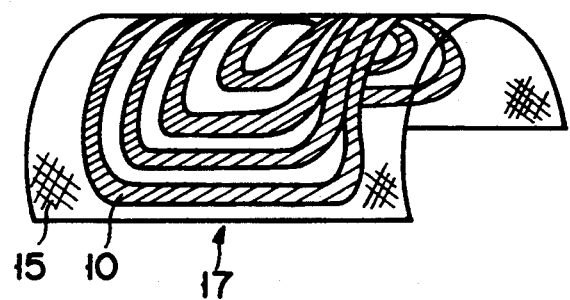
F I G. 10

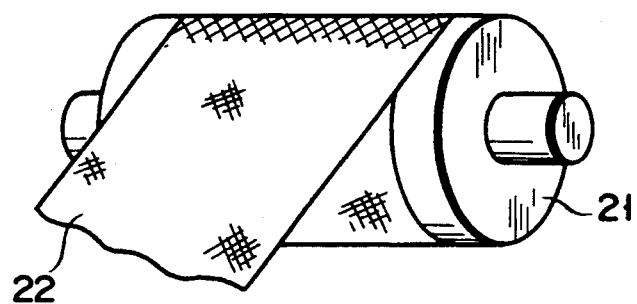
F I G. 11
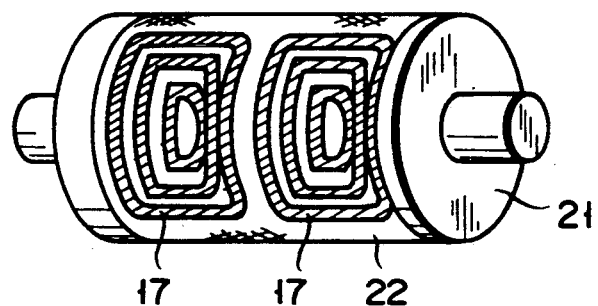
F I G. 12
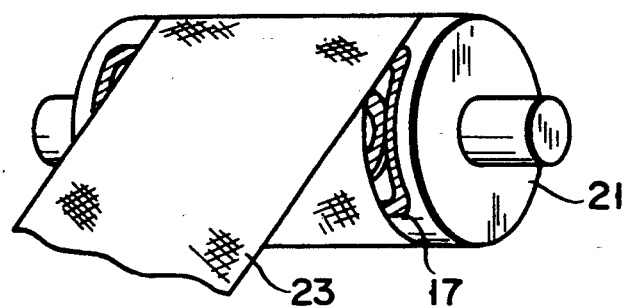
F I G. 13

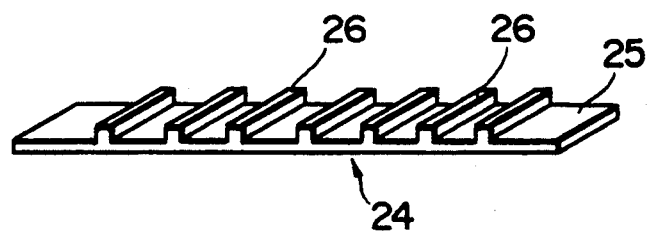
F I G. 14
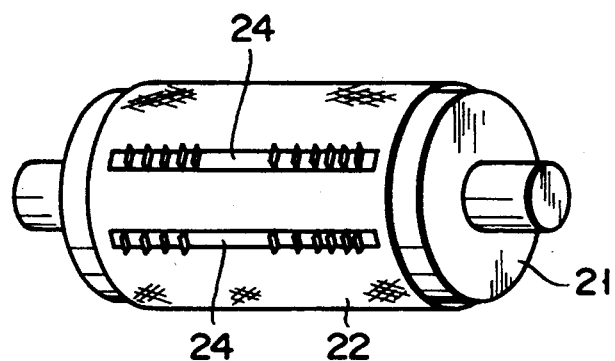
F I G. 15
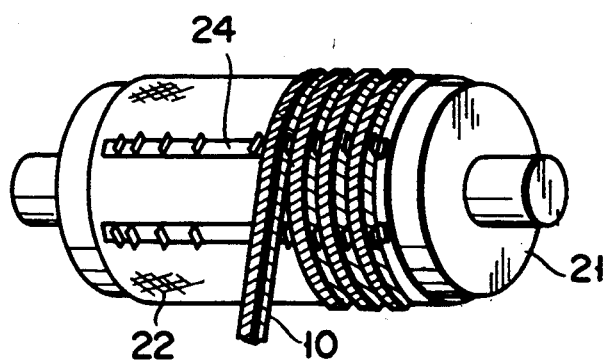
F I G. 16

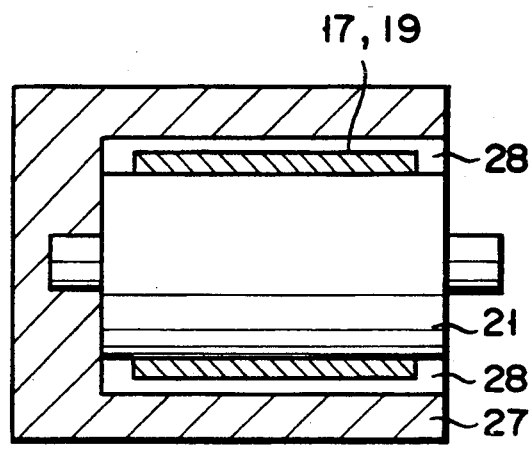
F I G. 17
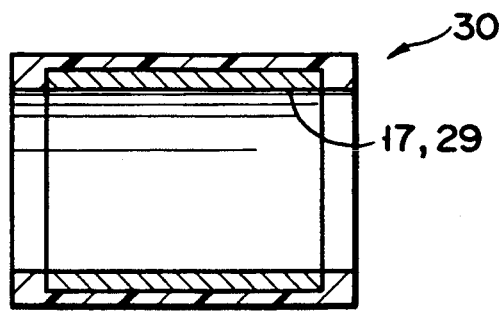
F I G. 18

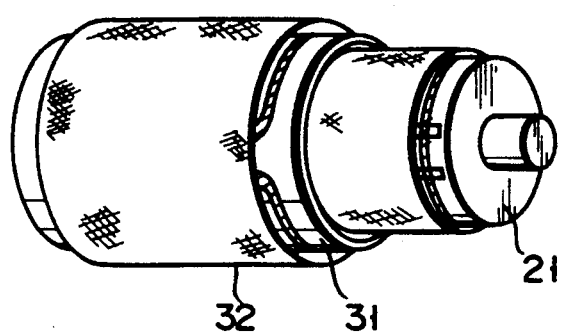
F I G. 22
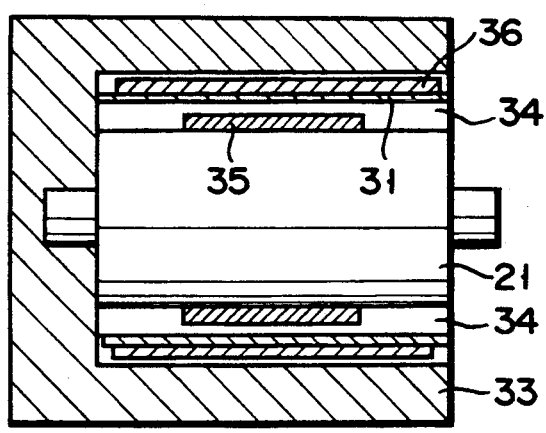
F I G. 23
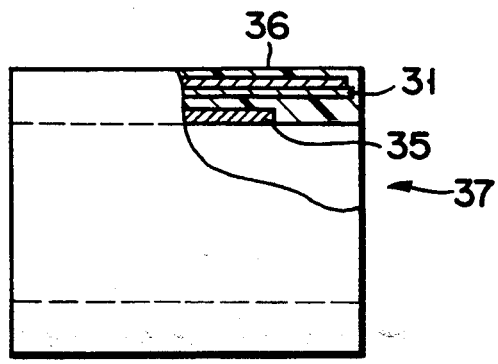
F I G. 24

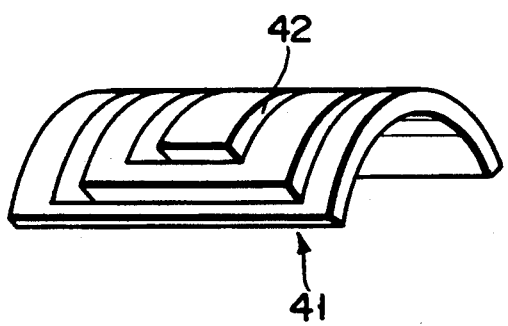
F I G. 25
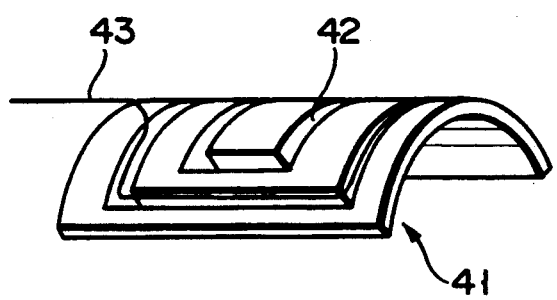
F I G. 26
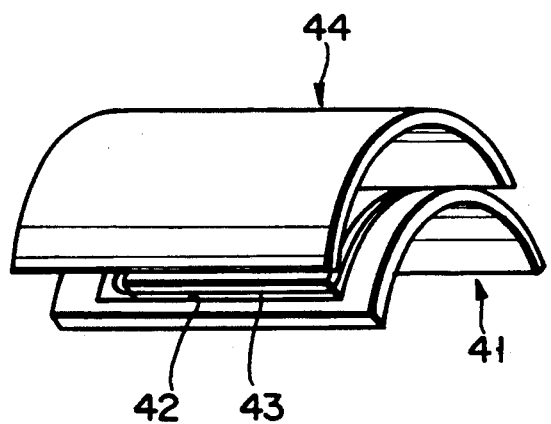
F I G. 27

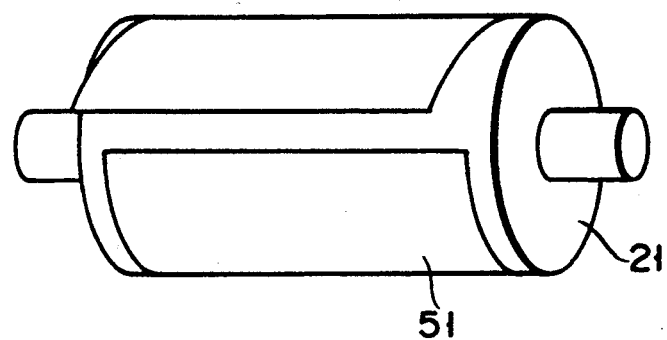
F I G. 31
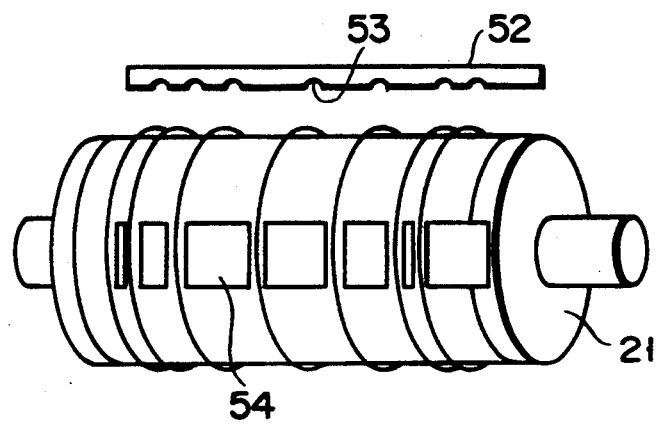
F I G. 32
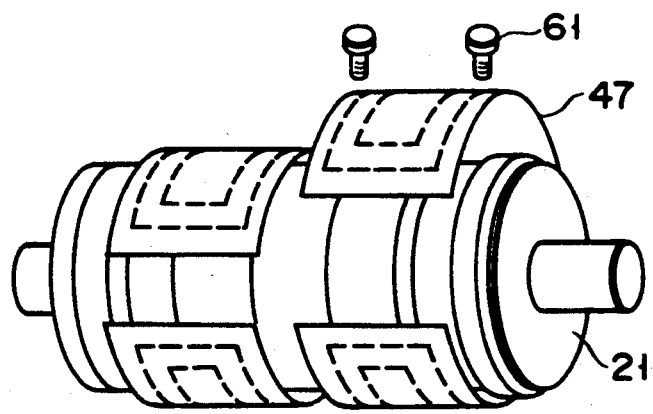
F I G. 33

METHOD OF MANUFACTURING A GRADIENT MAGNETIC FIELD COIL ASSEMBLY OF AN MRI APPARATUS

This is a continuation of application Ser. No. 07/975,989, filed on Nov. 13, 1992, which is a continuation of U.S. Ser. No. 07/530,603, filed on May 30, 1990 now abandoned.

BACKGROUND OF THE INVENTION

1. Field of the Invention

This invention relates to a method of manufacturing a gradient magnetic field coil assembly of an MRI apparatus.

2. Description of the Related Art

With an MRI apparatus, the gradient fields generated by Gx, Gy and Gz gradient magnetic field coils are superposed on static magnetic fields. The combination of the Gx, Gy and Gz gradient magnetic fields specifies a slice position of an object to be examined at which a tomographic image is obtained.

Each of the Gx and Gy gradient magnetic field coils comprises a plurality of saddle coils and the Gz gradient magnetic field coil comprises a solenoid coil. The accuracy of the slice position is much influenced by the positional accuracies of the saddle coils and the solenoid coil.

The conventional saddle coils are embedded in a molded resin member having a curved surface. The saddle coil assembly is manufactured as follows:

Wires which will form saddle coils are temporarily positioned on the flat surface of a metal mold by means of pins at predetermined positions. Molten resin is poured on the flat surface and cured. Thus, a flat molded resin member embedded with saddle coils is formed. The member is removed from the metal mold and is bent so as to have a predetermined curved surface. A plurality of molded resin members embedded with a plurality of saddle coils and a solenoid coil manufactured separately from the saddle coils is provided in a cylindrical molded resin body so that Gx, Gy and Gz gradient magnetic fields are produced.

However, the saddle coils are placed in the predetermined positions only by the pins, lowering the positional accuracies of the wires. This lowers the positional accuracies of the formed saddle coils, resulting in a low detecting accuracy of the slice position.

Although the wires are positioned by the pins along the flat mold surface, they are not positioned by the pins perpendicularly thereto. As a result, the wires wave on planes perpendicular to the flat mold surface, greatly lowering the perpendicular positional accuracies of the wires.

Since the molded resin members embedded with the saddle coils is bent after it has been formed flat, the positional accuracies of the saddle coils are not so good. Further, the higher the rigidity of the wires becomes, the lower the positional accuracies of the wires become.

SUMMARY OF THE INVENTION

The object of the present invention is to provide a method of manufacturing a gradient magnetic field coil assembly of an MRI apparatus. The assembly has high positional accuracies of coils. Thus, accuracy of the slice position is improved.

According to the present invention, there is provided a method of manufacturing a gradient magnetic coil assembly of an MRI apparatus. The assembly has a plurality of saddle coil assemblies and a solenoid coil. The method comprises the steps of:

(a) preparing a first mold formed with a groove having a shape corresponding to shape of a saddle coil, and a second mold to be fitted to said first mold;

(b) placing a wire assembly in said groove of said first mold to position said wire assembly therein;

(c) placing a cloth dipped with an adhesive on said wire assembly;

(d) fitting said second mold onto said first mold to push said wire assembly into said groove;

(e) curing the adhesive to adhere said cloth to said wire assembly, thereby forming a saddle coil assembly including said cloth and said wire assembly;

(f) removing said saddle coil assembly from said first and second molds;

(g) manufacturing a plurality of saddle coil assemblies by carrying out the steps (a) to (f);

(h) preparing a cavity mold and a core mold to be inserted in said cavity mold;

(i) temporarily connecting said saddle coil assemblies to said core mold, and winding a wire assembly around said core mold to form a solenoid coil;

(j) inserting said core mold in said cavity mold to place said saddle coil assemblies and said solenoid coil in a cylindrical space defined between said core mold and said cavity mold;

(k) pouring resin in said cylindrical space and curing said resin to form a gradient magnetic field coil assembly including a cylindrical resin member in which said saddle coil assemblies and said solenoid coil are embedded; and (1) removing said gradient magnetic field coil assembly from said core mold and said cavity mold.

Since saddle coils of the present invention are formed of wires positioned in the grooves of the first mold, the positions of the saddle coils are determined by the positions of the grooves. Therefore, high positioning accuracies of the wire assemblies and high positional accuracies of the saddle coils are obtained. The resultant solenoid coil, is formed of a wire positioned by guides and having positioning accuracies of both the saddle coils and the solenoid coil increased. The accuracy of the slice position is then improved as compared to the prior art.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention. Together with the general description given above and the detailed description of the preferred embodiments given below, the specifications serves to explain the principles of the invention.

FIGS. 1A, 1B and 1C are perspective views of Gx, Gy and Gz gradient magnetic filed coils, respectively;

FIGS. 2 to 10 show the steps of manufacturing a saddle coil assembly, FIG. 2 being a perspective view of a wire assembly, FIG. 3 being a perspective view of a first mold, FIG. 4 being a cross-sectional view of the first mold, FIG. 5 showing a state in which the wire assemblies are mounted on the first mold, FIG. 6 being a cross-sectional view of the first mold on which glass cloth and the wire assembly is mounted, FIG. 7 being an enlarged cross-sectional view of the encircled portion VII in FIG. 6, FIG. 8 being a perspective view of the first and second molds fitted together, FIG. 9 being a cross-sectional view of FIG. 8, and FIG. 10 being a perspective view of the saddle coil assembly;

FIGS. 11 to 18 show the steps of manufacturing a gradient coil assembly, FIG. 11 being a perspective view of a bobbin around which glass cloth is being wound, FIG. 12 being a perspective view of the bobbin to which the saddle coil assemblies are temporarily connected, FIG. 13 being a perspective view of the bobbin to which the saddle coil assemblies are temporarily connected and around which glass cloth is being wound, FIG. 14 being a perspective view of a guide, FIG. 15 being a perspective view of the bobbin on which the guides are mounted, FIG. 16 being a perspective view of the bobbin around which a wire assembly is being wound, FIG. 17 being a cross-sectional view of a cavity mold in which the bobbin is inserted and FIG. 18 being a cross-sectional view of the gradient magnetic field coil assembly;

FIGS. 19 to 24 show the steps of manufacturing a shield type gradient magnetic assembly, FIG. 19 being a perspective view of a pipe, FIG. 20 being a perspective view of a bobbin around which a wire assembly is being wound, FIG. 21 being a perspective view of a bobbin around which glass cloth is being wound, FIG. 22 being a perspective view of the pipe in which the bobbin is inserted, FIG. 23 being a cross-sectional view of the cavity mold in which the bobbin is placed, and FIG. 24 being a cross-sectional view of the shield type gradient magnetic field coil assembly;

FIGS. 25 to 29 show further steps of manufacturing a saddle coil assembly, FIG. 25 being a perspective view of a first mold, FIG. 26 being a perspective view of the first mold on which wire assemblies are mounted, FIG. 27 being a perspective view of the first and second molds fitted together, FIG. 28 being a cross-sectional view of the combination of the first and second molds, FIG. 29 being a perspective view of the saddle coil assembly;

FIGS. 31 to 33 show still further steps of manufacturing a gradient magnetic field coil, FIG. 31 being a perspective view of a bobbin around which an insulating sheet is being wound, FIG. 32 being a perspective view of the bobbin on which a solenoid coil is being formed and FIG. 33 being a perspective view of the bobbin to which the saddle coil assemblies and the solenoid coil are temporarily connected.

DETAILED DESCRIPTION OF THE PREFERRED EMBODIMENTS

As shown in FIG. 1A, a Gx gradient magnetic coil comprises two pairs of saddle coils 1, each pair being arranged diametrically opposed to each other in the direction of the x axis. As shown in FIG. 1B, a Gy gradient magnetic coil also comprises two pairs of saddle coils 1, each pair being arranged diametrically opposed to each other in the direction of the y axis. Referring to FIG. 1C, a Gz gradient magnetic coil comprises a solenoid coil 2 surrounding the z axis.

A Gx-Gy-Gz gradient magnetic field coil assembly is formed by a cylindrical member, and the saddle coils 1 and the solenoid coil 2 wound around the cylindrical member.

Referring to FIGS. 2 to 10, a method of manufacturing a saddle coil assembly will be explained.

Figure 2:
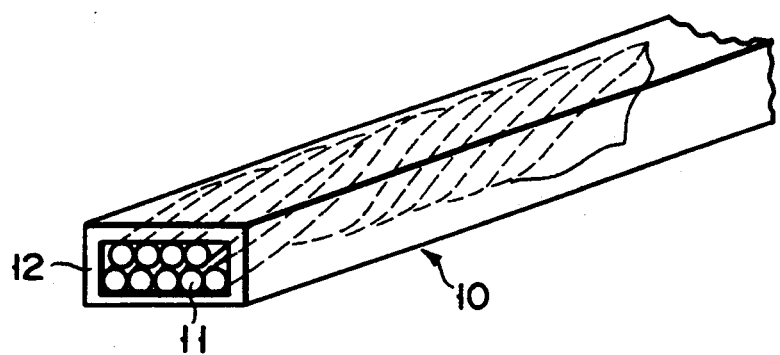

Wire assemblies 10 as shown in FIG. 2 are prepared. The wire assembly 10 comprises a plurality of wires 11 twisted together and glass cloth 12 made of electrically insulating material and covering the wires 11. The wire 11 is made of electrically conductive material such as copper and is coated with an electrical insulator. An adhesive is dipped in the glass cloth 12. Alternatively, the adhesive may be coated to the glass cloth 12, in later steps.

Figure 3:
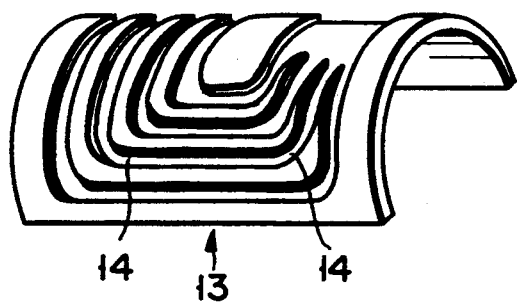
Figure 4:
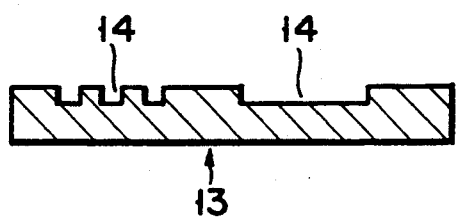

Next, a first mold 13 as shown in FIGS. 3 and 4 is prepared. In the outer surface of the first mold 13 are formed grooves 14 having a width corresponding to that of the wire assemblies 10. When the saddle coils of a single layer are mounted on the first mold 13, the depth of each groove 14 is equal to the thickness of the wire assembly 10. When the saddle coils of double layers are mounted on the first mold 13, each groove 14 is twice as wide as the thickness of the wire assembly 10.

Figure 5:
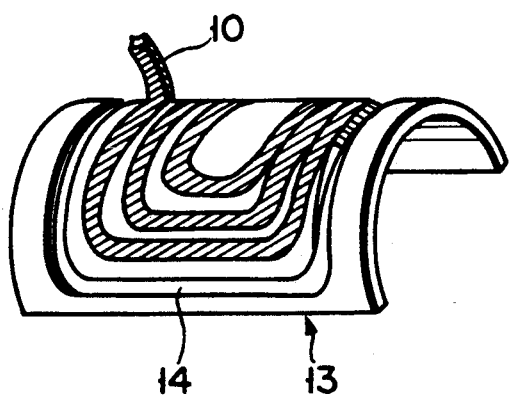
Figure 6:
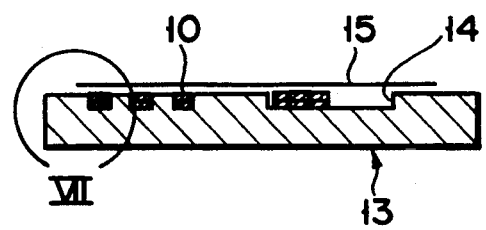
Figure 7:
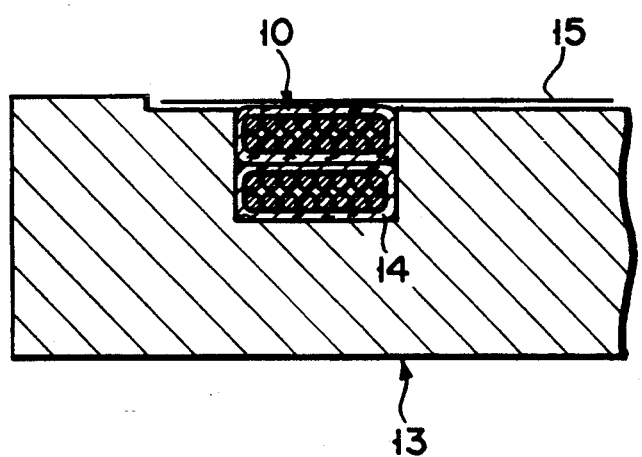

As shown in FIGS. 5, 6 and 7, the wire assemblies 10 are fitted in the grooves 14. The walls of the grooves 14 are chemically treated so that the adhesive applied to the wire assemblies 10 is not attached thereto. For example, the walls of the grooves 14 are coated with polytetrafluoroethylene.

As shown in FIGS. 6 and 7, the first mold 13 is covered with glass cloth 15 dipped with an adhesive.

Referring to FIG. 8, a second mold or a cover 16 is fitted on the first mold 13 and is fixed thereto by means of a plurality of bolts 17 so that the wire assemblies 10 are pressed into the grooves 14.

In the state shown in FIG. 9, the first and second molds 13 and 16 are heated, and the wire assemblies 10 and the glass cloth 15 are adhered to each other. At the same time, the adhesive is cured so that the glass cloth 15 is changed into a hard plate. In this way, the saddle coil assembly 17 comprising the wire assemblies 10 and the glass cloth 15 is manufactured.

Since the walls of the grooves 14 are chemically treated as mentioned above, the wire assemblies 17 are not adhered to the walls of the grooves 14.

As shown in FIG. 10, the saddle coil assembly 17 is removed from the first and second molds 13 and 16.

A plurality of saddle coil assemblies 17 are made and used for manufacturing a Gx-Gy-Gz gradient magnetic field assembly as will be described later.

As described above, the saddle coil assemblies 17 are formed by placing the wire assemblies 10 in the grooves 17 of the first mold 13. Specifically, as shown in FIG. 9, the wire assemblies 10 are held by the lateral walls of the grooves 14 so as not to be displaced in the direction l, and also held by the lower surface of the second mold 16 and the bottom walls of the grooves 14 so as not to be moved in the direction m. As the positions of the saddle coils are determined by the grooves of the first mold 13, both the wire assemblies 10 and the saddle coils 17 are positioned very accurately. Accordingly, the slice position produced by the magnetic field is more accurate compared with the conventional coil.

Referring to FIGS. 11 to 18, a method of manufacturing a Gx-Gy-Gz gradient coil assembly 2 by using a plurality of saddle coil assemblies 17 and a solenoid coil 2 is shown.

A cylindrical bobbin (core mold) 21 as shown in FIG. 11 is prepared. Glass cloth 22 is wound around the bobbin 21. The outer surface of the bobbin 21 is chemically treated so that the later described epoxy resin is not adhered thereto.

Next, as shown in FIG. 12, the saddle coil assemblies 17 are temporarily attached to glass cloth 23. Any temporary attached means, for example, pins or an adhesive can be used.

As shown in FIG. 13, the glass cloth 23 is wound around the saddle coil assemblies 17.

Then, the solenoid coil 2 is manufactured in accordance with the steps shown in FIGS. 14 to 16 as follows:

Guides 24 as shown in FIG. 14 are attached to the bobbin 21 as shown in FIG. 13. The guide 24 comprises a base plate 25 and fins 26 arranged at a spacing corresponding to the width of the wire assembly 10 of the solenoid coil 2. The radius of curvature of the base plate 25 corresponds to that of the bobbin 21.

As shown in FIG. 16, the wire assemblies 10 are wound around the glass cloth 23 of the bobbin 21 so as to be disposed between the adjacent fins 26 of the guides 24. In this way, the solenoid coil 2 is manufactured.

In this state, the saddle coil assemblies 17 and the solenoid coil are temporarily connected to the bobbin 21.

Next, a cylindrical cavity mold 27 as shown in FIG. 17 is prepared. Inserted in the cavity mold 27 is the bobbin 21 to which the saddle coil assemblies 17 and the solenoid coil 29 are temporarily connected. An annular space 28 is defined between the bobbin 21 and the cavity mold 27, and the saddle coil assemblies 17 and the solenoid coil 29 are placed in the space 28.

Thereafter, non-cured epoxy resin is poured in the annular space 28 and cured so that a cylindrical resin member or a Gx-Gy-Gz gradient magnetic field coil assembly 30 in which the saddle coil assemblies 17 and the solenoid coil 29 are embedded is manufactured. Other resin may be used instead of epoxy resin.

As shown in FIG. 18, the gradient magnetic field coil assembly 30 is removed from the bobbin 21 and the cavity mold 27.

Because the solenoid coil 29 is also manufactured by the wire assemblies 10 being accurately positioned, the slice position of the object to be examined is accurately set as compared with the conventional case.

The object of the use of the glass cloth 21 and 22 in FIGS. 11 and 12 is to insulate the saddle coil assemblies 17 and the solenoid coil 29, and to enhance the strength of the gradient magnetic field coil assembly 30 by dipping the epoxy resin 28 in the glass cloth 21 and 22. Electrically insulating plates may be used instead of the glass cloth 21 and 22.

The saddle coil assemblies 17 and the solenoid coil 29 are fixed together, preventing the coil assemblies 17 and the solenoid coil 29 from being vibrated by the electromagnetic force generated thereby.

Referring to FIGS. 19 to 24, a method of manufacturing a shield type gradient magnetic field coil assembly will be explained.

Generally, a shield type gradient magnetic filed coil assembly is provided with a normal Gx-Gy-Gz gradient magnetic field coil assembly, and a cancel Gx-Gy-Gz gradient magnetic field coil assembly for eliminating a magnetic field leakage generated by the normal coil assembly. The cancel Gx-Gy-Gz gradient magnetic field coil assembly has also saddle coil assemblies and a solenoid coil.

Figure 19:
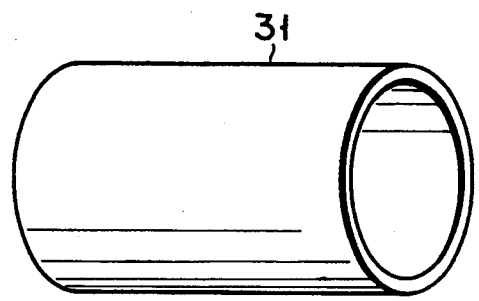

A pipe 31 as shown in FIG. 19 is prepared.

Figure 20:
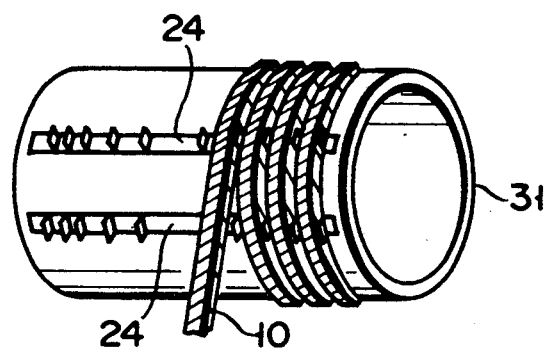

As shown in FIG. 20, guides 24 are provided on the pipe 31 and a wire assembly 10 is wound therearound so that a solenoid coil for a cancel coil assembly is temporarily connected to the pipe 31.

Figure 21:
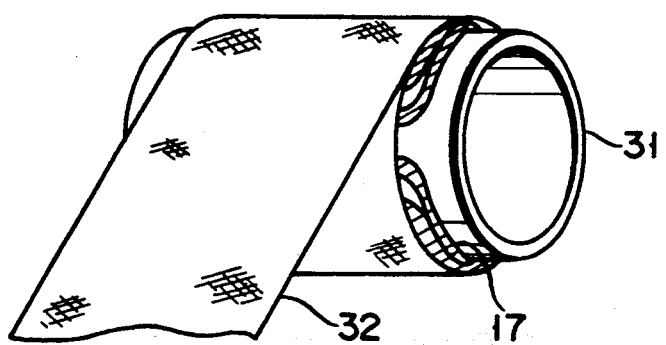

Next, as shown in FIG. 21, saddle coil assemblies 17 for the cancel coil assembly are temporarily connected to the pipe 31, and glass cloth 32 is wound therearound.

After then, as shown in FIG. 22, a bobbin 21 to which saddle coil assemblies 17 and a solenoid coil 29, for the normal gradient magnetic field coil assembly is inserted in the pipe 31.

As shown in FIG. 23, the bobbin 33 and the pipe 31 are inserted in a cavity mold 33 so that an annular space 34 is defined between the bobbin 21 and the cavity mold 33. In the annular space 34 are disposed the combination 35 of the saddle coil assemblies and the solenoid coil for the normal gradient magnetic field coil assembly, the pipe 31 and the combination 36 of the saddle coil assemblies and the solenoid coil for the cancel coil assembly.

Molten epoxy resin is poured in the annular space 34 and cured. As a result, a cylindrical resin member or a shield type gradient magnetic field coil assembly 37 is manufactured in which are embedded the combination 35 of the saddle coil assemblies and the solenoid coil for the normal gradient magnetic field coil assembly, the pipe 31 and the combination 36 of the saddle coil assemblies and the solenoid coil for the cancel coil assembly.

As shown in FIG. 24, the shield type gradient magnetic coil assembly 37 is removed from the bobbin 21 and the cavity mold 33.

In this way, the shield type gradient magnetic field coil assembly is also positioned accurately and, therefore, the slice position of the object to be examined is accurately set as compared with the conventional case.

Another method of manufacturing a solenoid assembly will be explained with reference to FIGS. 25 to 29.

A first mold 41 as shown in FIG. 25 is prepared. The first mold 41 is a metal mold having a uniform thickness and a sectorial cross section. On the outer surface of the first mold 41 are formed grooves 42 corresponding to the saddle type wiring pattern, by means of an NC machine.

As shown in FIG. 26, wires 43 are placed in the grooves 42 of the first mold 41.

Figure 28:
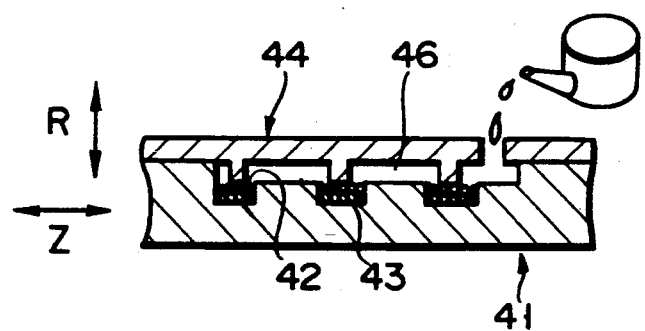

As shown in FIGS. 27 and 28, a second mold 44 is fitted to the first mold 41. The second mold 44 has a uniform thickness and a sectorial cross section which correspond to the outer surface of the first mold 41.

Referring to FIG. 28, projections 45 are formed on the portions of the undersurface of the second mold 44 which correspond to the grooves 42 of the first mold 41. As the second mold 44 engages the first mold 41, the projections 45 press the wires 43. This prevents the wires 43 from waving.

Figure 29:
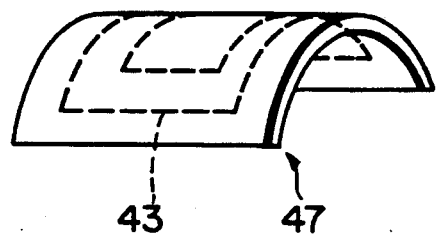

In a space 46 defined between the first and second mold 41 and 44 is poured epoxy resin under vacuum. After the epoxy resin has been cured, a cylindrical resin member or a saddle coil assembly 47 is produced, as shown in FIG. 29. Connecting passages are formed between the adjacent grooves in order to flow the resin easily.

Figure 30:
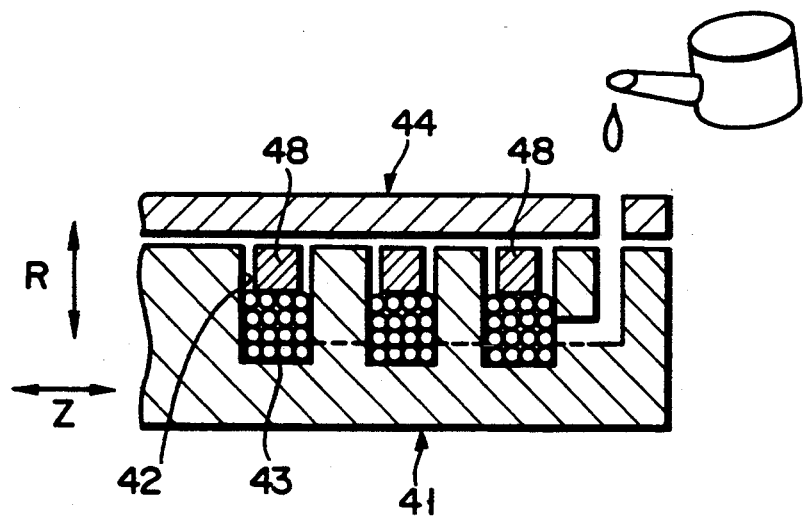
FIG. 30 is a cross-sectional view of the combination of first and second molds according to another embodiment.

The first and second molds 41 and 44 may be formed as shown in FIG. 30. Specifically, the projections 45 are not formed on the second mold 44, but spacers 48 are arranged between the wires 43 inserted in the grooves 42 and the undersurface of the second mold 44 so that the wires 43 are pressed by the spacers 48 on the bottom walls of the grooves 42.

A plurality of saddle coil assemblies 47 are manufactured for the Gx-Gy-Gz gradient magnetic field coil assembly or the shield type gradient magnetic field coil assembly.

FIGS. 31 to 33 show the steps of a further method of manufacturing a Gx-Gy-Gz gradient magnetic field coil assembly.

As shown in FIG. 31, a bobbin 21 is prepared and an insulating sheet 51 is wound therearound.

A solenoid guide 52 as shown in FIG. 32 is prepared. A wire is wound therearound by making the wire engaging the grooves 53 of the guide 52. In this case, the wire may be set in position by means of the spacer 54.

As shown in FIG. 33, a plurality of saddle coil assemblies 47 are mounted on the bobbin 21 by bolts 61. Thereafter, as described above, the bobbin is inserted in the cavity mold and resin is poured in the space defined between the bobbin and the cavity mold. Thus, the Gx-Gy-Gz gradient magnetic filed coil assembly is manufactured.

In place of the gradient magnetic field coil assembly comprising saddle coil assemblies and a solenoid coil, a gradient magnetic field coil assembly only consisting of saddle coil assemblies or a gradient magnetic coil assembly only consisting of a solenoid coil can be manufactured according to the present invention.

The method of manufacturing a shield type gradient magnetic field coil assembly as explained above can be applied to the manufacture of a plurality of saddle coil assemblies having diameters largely different from each other and a gradient magnetic field coil assembly having a solenoid coil.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a gradient magnetic field coil assembly, comprising the steps of:
   (a) manufacturing a plurality of saddle coil assemblies by carrying out the following steps (b) to (g);
   (b) preparing a first cylindrical mold formed with a groove having portions adjacent to one another and spaced apart and having a shape corresponding to the shape of a saddle coil, and a second mold to be fitted to said first mold;
   (c) placing a wire assembly in said groove of said first mold to position said wire assembly therein, said wire assembly having portions adjacent to one another and spaced apart thereby having a spatial relationship;
   (d) placing a sheet containing a curable material on said wire assembly;
   (e) fitting said second mold onto said first mold to maintain said wire assembly in said groove;
   (f) curing said curable material to harden it to said shape of said saddle coil while simultaneously adhering said wire assembly to said curable material to maintain said wire assembly in said saddle coil shape and maintaining said spatial relationship to form a saddle coil assembly, while said wire assembly is in the groove of said first mold;
   (g) removing the saddle coil assembly from said first and second molds;
   (h) preparing a cavity mold and a core mold to be inserted in said cavity mold;
   (i) temporarily attaching said saddle coil assemblies to said core mold, and winding a wire assembly around said saddle core assemblies on said core mold to form a solenoid coil;
   (j) inserting said core mold in said cavity mold to place said saddle coil assemblies and said solenoid coil in a cylindrical space defined between said core mold and said cavity mold;
   (k) injecting resin in said cylindrical space and curing said resin to form a gradient magnetic field coil assembly including a cylindrical resin member in which said saddle coil assemblies and said solenoid coil are embedded; and
   (l) removing said gradient magnetic field coil assembly from said core mold and said cavity mold.

2. The method of claim 1 wherein said curable material is a cloth coated with an adhesive.

3. The method of claim 1 wherein said sheet containing a curable material includes a cloth dipped in an adhesive.

4. The method of claim 1 wherein said wire assembly includes a plurality of wires and a cloth dipped in an adhesive and covering the wires.

5. The method of claim 1 wherein in step d, said sheet containing a curable material is placed on an outer surface of said first mold to contact the surface of said first mold in which a groove is formed and a wire assembly is located within the groove.

6. The method of claim 1 wherein in step f, curing is performed with the sheet and the wire assembly pressed together between said first and second molds.

* * * * *